United States Patent [19]

Richard

[11] 4,441,140

[45] Apr. 3, 1984

[54] PRINTED CIRCUIT BOARD HOLDER

[75] Inventor: Maurice Richard, New Bedford, Mass.

[73] Assignee: Raytheon Company, Lexington, Mass.

[21] Appl. No.: 454,924

[22] Filed: Jan. 3, 1983

Related U.S. Application Data

[63] Continuation of Ser. No. 208,713, Nov. 20, 1980, abandoned.

[51] Int. Cl.³ ............................................. H05K 7/20
[52] U.S. Cl. .................................... 361/386; 361/399
[58] Field of Search .............. 361/385, 386, 387, 388, 361/395, 399; 357/81, 82; 174/16 HS; 211/41

[56] References Cited

U.S. PATENT DOCUMENTS

| | | | |
|---|---|---|---|
| 3,243,660 | 3/1966 | Yuska | 361/388 |
| 3,395,318 | 7/1968 | Laemer | 361/386 |
| 3,506,877 | 4/1970 | Owen | 361/386 |
| 3,631,325 | 12/1971 | Wenz | 361/386 |
| 3,909,679 | 9/1975 | Petri | 361/388 |
| 4,092,697 | 5/1978 | Spaight | 361/386 |
| 4,330,812 | 5/1982 | Token | 361/399 |

*Primary Examiner*—G. P. Tolin
*Attorney, Agent, or Firm*—Martin M. Santa; Richard M. Sharkansky; Joseph D. Pannone

[57] ABSTRACT

A circuit board holder and module including the circuit board and holder are described wherein a cover plate integral with the holder is in thermal contact with the heat producing elements mounted on the circuit board. The heat generated in the elements is transferred through the cover plate to the peripheral portions of the holder where the holder is in contact with a heat sink.

11 Claims, 4 Drawing Figures

PRINTED CIRCUIT BOARD HOLDER

CROSS-REFERENCE TO RELATED CASES

This is a continuation of application Ser. No. 208,713, filed Nov. 20, 1980, now abandoned.

BACKGROUND OF THE INVENTION

This invention relates to printed circuit board holders and more particularly to a holder and module comprised of said holder and board adapted to transfer heat from circuit components mounted on the printed circuit board to a heat sink.

Certain printed circuit board components, specifically, integrated circuit chips of the dual-in-line pin (DIP) type, are limited in the maximum temperature in which they are capable of operating. This operating temperature is determined by the heat dissipated within the integrated circuit element itself, the heat dissipated in other heat-producing elements including other integrated circuit chips, and the heat dissipating properties of the printed circuit board holder which is in thermal contact with the integrated circuit chip and a heat sink.

It is generally desired that the volume occupied by the electrical circuitry including the holder be minimized thereby resulting in the increase in the heat generated per unit volume or area. It is therefore necessary that the holder for the printed circuit board be properly configured to effectively carry away the heat generated from the integrated circuit chips to a heat sink by providing a low thermal impedance heat path.

The features by which the improvement in heat dissipation by the holder of this invention is achieved are made more evident by a description of the printed circuit board holders which had been available heretofore, together with their performance characteristics. FIG. 1 shows a prior-art printed circuit board holder 10, together with an exploded view of the printed circuit board 18 and an illustrative DIP integrated circuit 21 which is to be soldered to connector holes 19 on the printed circuit board 18. The holder 10 comprises metal frame 11 having a plastic pin connector 14 at one end. The connector 14 has electrically conductive pins 15 which are connected to respective pins (not shown) on the far side of the connector 14. These far side pins correspond with connector holes 20 of printed circuit board 18. The holes 20 are connected by printed circuit wiring (not shown) to holes 19 connected to DIP integrated circuits 21 or to resistor or capacitor components (not shown) which also may be mounted on the circuit board 18, thereby providing electrical connection between the pins 15 and the electrical components on the circuit board. The plastic connector body 14 has embedded in it metal pin shields 141. Guide pins 16 are also imbedded into the ends of the plastic connector body 14. The metal frame 11, electrically insulating solder mask 17, and the printed circuit board 18 are assembled with the rivets 22. The frame 11 and the mask 17 have slots 12 and webs 13. The DIP circuit 21 has connector pins 211 which straddle the webs 13 and which project through slots 12 into holes 19 of the printed circuit board 18. The underside 212 of the DIP circuit 21 makes thermal contact to the web 13 of frame 11 through a thermally conductive electrically-insulating tape 23. After the assembly as above described, electrical connection of the pins 15 211 is made to the printed circuit board 18 by wave soldering techniques.

A module 1 assembled as shown in FIG. 1 is capable of dissipating a total of 4.5 watts produced by circuit elements such as DIP package 21 while limiting the temperature rise of the circuit elements to 60° above the temperature of a heat sink (not shown) such as a cooling fluid in spring finger contact with the edges 24 of frame 11. The heat sink forms a part of the mechanical and electrical configuration into which the module 1 of FIG. 1 is inserted. Although the thermal dissipation properties of the module 1 are satisfactory, the module 1 is less desirable from a production standpoint. Because of the design of module 1, assembly of its many parts requires hand assembly procedures and is not amenable to automation and thereby the module 1 is costly.

As stated earlier, assembly of module 1 requires the printed wiring board 18 must be solder masked by an electrical insulator 17 inserted between the printed wiring board 18 and the frame 11. The board 18 is then riveted to the frame 11 by rivets 22. Next, the thermally conductive tape 23 and the DIP circuits 21 are placed in position on frame 11 and the wave soldering of the preceding paragraphs completes the assembly. During the soldering process and when the module is in use, the pin shields 141 have a tendency to fall off the connector 14. In addition, the connector 14, being of plastic, requires that the keying pins 16 be inserted using adhesive and held in a prescribed position while the adhesive sets. These keying pins 16 frequency become loose. Therefore, it is seen that the module 1 of FIG. 1 has substantial inadequacies from a fabrication and reliability standpoint.

For those circuit configurations where the total dissipation of the components mounted on the printed circuit board is one watt or less, sufficient power dissipation to limit the temperature rise to 60° C. is obtained by mounting the circuit board 18 on the "open frame" type of holder 31 shown on FIG. 2. The circuit board 18 is shown with DIP circuits 21 and connector 14 placed within the holder 31 ready to be secured thereto by rivets 22. The assembly of the printed circuit board 18 and the holder 31 of FIG. 2 has several advantages over the module 1 of FIG. 1. The most significant advantage is that the printed circuit board 18 may be soldered to its DIP circuits 21 and to its connector 14 by conventional wave soldering techniques before the assembly is riveted to frame 31. The assembly process may be highly automated, thereby greatly reducing the cost of manufacture. The frame 31 has an integral pin shield 311 and, therefore, the pin shields cannot fall off as they may in the configuration of FIG. 1. The keying pins 16 are also secured to the metallic frame 31 by a press fit so that they also are very securely mounted to frame 31 in comparison with their imbedment in the plastic connector 14 of FIG. 1.

Despite the mechanical advantage and ease of fabrication, the assembly of the frame 31 and the circuit board 18 of FIG. 2 has the limitation that the total allowance power dissipation of the DIP circuits 21 for the allowed 60° C. temperature rise is limited to one watt. Since many circuit configurations exist which exceed one watt dissipation, it was necessary to resort to the more expensive assembly configuration of module 1 of FIG. 1 in those circumstances. In order to increase the power dissipation capability of the circuit board 18-frame 31 assembly, a cover plate 32 was attached to the assembly by the rivets 22. The cover plate 32 was placed in thermal contact with the DIP circuits 21 on the printed circuit board 18 by using a thermally conductive substance (not shown) between the components 21 and the cover plate 32. The electrically conductive material was also placed between the overlapping regions 33', 33" of the cover plate 32 and the frame 31. Because of the constraints on the size of the frame 31 and the area occupied by the DIP circuits 21, the available area of contact of the cover plate 32 and the frame 31 was only along their edges. Since the width of the regions 33', 33" on frame 31 is only appropriately 0.050 inch, the total area available for transfer of heat from the cover plate 32 to the frame 31 was not substantial, and the total power which could be dissipated for a 60° C. temperature rise using the cover plate 32 was only about 1.5 watts, only a slight improvement over the 1 watt power dissipation without the cover plate 32 for the same temperature rise.

SUMMARY OF THE INVENTION

It is therefore an object of this invention to provide an improved circuit board holder which will have the high power dissipation capability of the holder of FIG. 1 without its attendant fabrication difficulties and costs. Such an improved holder should have the fabrication economies of the holder of FIG. 2 without its limitations with respect to its heat dissipation properties.

This object and other objects are provided by the circuit board holder of this invention by fabricating the circuit board holder in a manner such that a heat conducting plate in thermal contact with the heat producing DIP circuits is formed as an integral element of the circuit board holder, thereby maximizing the heat transfer capability between the cover plate and the portion of the holder which is in contact with a heat sink. The heat conducting plate may also contain internally projecting fins formed integrally with the plate, further increasing the heat transfer capability of the holder and also serving as structural reinforcement for the plate while providing electrical shielding of the terminals of the DIP circuits.

BRIEF DESCRIPTION OF THE DRAWINGS

Further features and objects of the invention will be apparent from the subsequent detailed description of the invention taken in connection with the accompanying drawings, wherein.

DESCRIPTION OF THE PREFERRED EMBODIMENT

Figure 3:
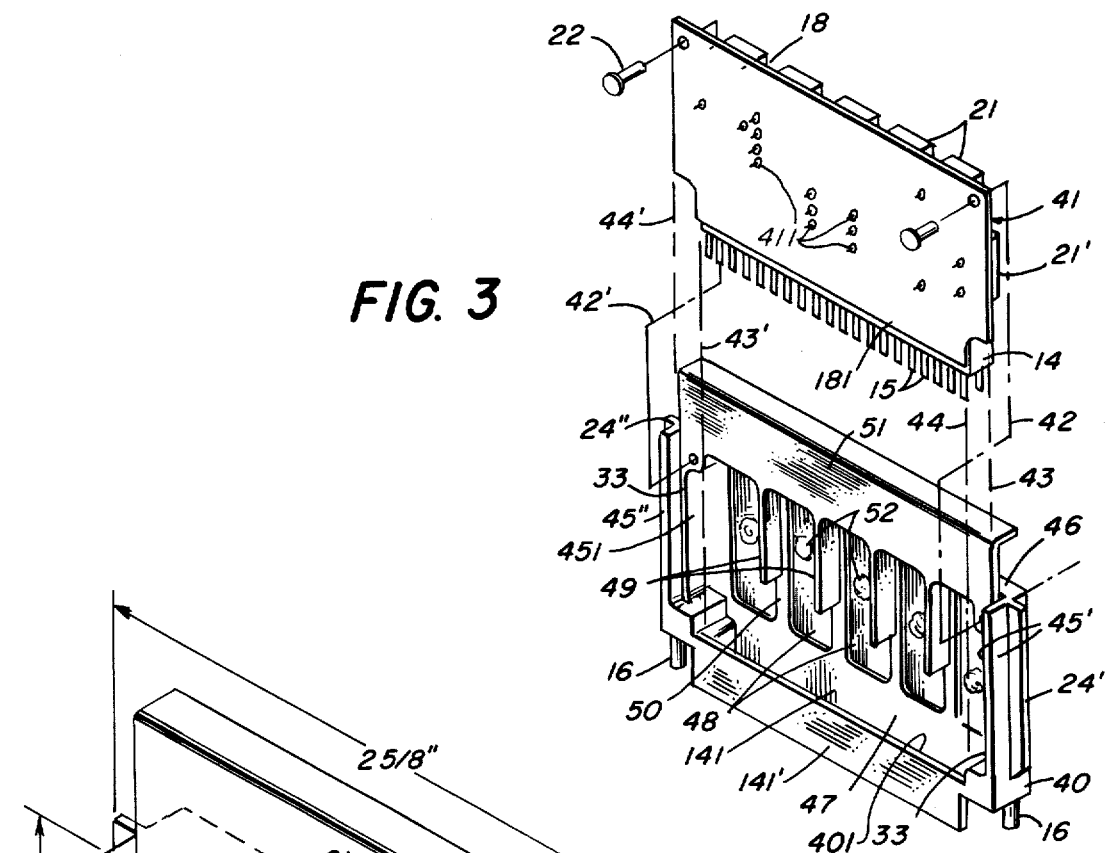
FIG. 3 is a partially exploded perspective view of the holder of this invention.
Figure 4:
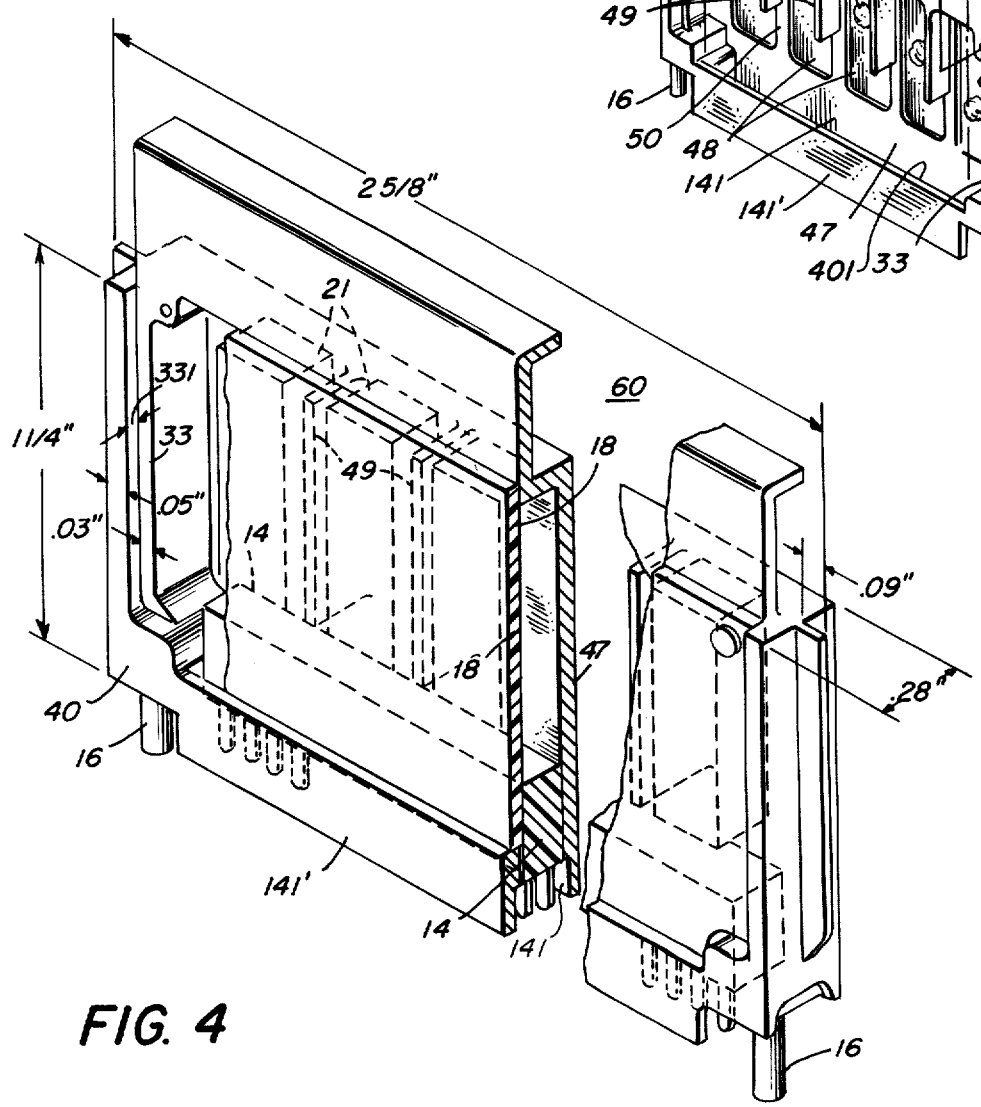
FIG. 4 is a perspective view partially in cross-section of the holder of this invention.

A preferred embodiment of the printed circuit board holder 40 of this invention is shown in FIGS. 3 and 4. Also shown in the figures is a completed assembly of DIP circuit components 21, a resistor or capacitor 21', connector 14, and circuit board 18 to which the circuit components 21 and connector 14 have been wave soldered to form a completed circuit board 41. The completed circuit board 41 is shown separate from the board holder 40 in FIG. 3 in order that the details of the holder 40 not be obscured by the circuit board. The completed circuit board 41 is placed into the holder 40 as indicated by the direction lines 42, 43 and 44. After insertion of the printed circuit board assembly 41 into the holder 40 the rivets 22 secure the completed board 41 in holder 40.

Referring to FIG. 3 it is seen that the holder 40 is a unitary structure having two sides 45', 45" connected to a third side 46 at the edges of plate 47. The plate 47 has an extension at the end of the holder 40 opposite side 46 forming on pin shield 141. The other pin shield 141' is opposite shield 141 and spans the space between sides 45. The height of the opening between the pin shields 141 is slightly greater than the height of connector 14 to allow connector 14 to be inserted, but insufficient to allow the combined thickness of connector 14 and printed circuit board 18 to enter thereby providing a stop at board edge 181. The board holder 40 is preferably made of high thermal conductance material such as aluminum or copper and preferable may be formed by casting. The bottom plate 47 has depressions 48 into which the DIP circuit components 21 are partially inserted. Depressions 48 allow the bottom plate 47 to be thicker than it otherwise could be and therefore plate 47 provides better thermal conductance between the depressions 48 and the thermal transfer guides 24. The height of the supporting shoulder 33 above the surface of plate 47 is less than the height of the DIP circuits 21 above the surface of the board 18, therefore absent the depressions 48 the height of the DIP circuits 21 would prevent the assembled circuit board 41 from resting on the shoulder 33. The sides 45, 46 and the pin shields 141 in combination define a peripheral boundary of the frame portion of the holder 40.

Ribs 49 formed integrally with the main body of holder 40 have one edge in common with the thicker portion 50 of plate 47 and another edge in common with handle 51. The ribs 49 serve as heat conducting elements between the plate 47 and the handle portion 51 which conducts heat toward the side 45 and edges 24. The handle 51 may in some applications be air cooled to thereby further increase the heat dissipation properties of the holder of this invention. The ribs 49 also provide more structural strength to the thin bottom plate 47. Thermally conducting liquid 52 is placed in depression 48 of plate 47 to correspond with the position of a heat generating element 21. Therefore, when the assembled circuit board 41 is placed within the holder 40 and riveted to form a complete module assembly, the liquid 52 will be in thermal contact with each heat producing element 21 and in thermal contact with the bottom plate 47. The heat conducting fluid 52 is preferably nonelectrically conductive in order to avoid causing electrical short circuits to the pins of the circuit elements 21 or of the circuit board 18. If desired, the heat conducting material 52 may be an epoxy like substance which hardens after the circuit board assembly 41 has been assembled within the holder 40.

Figure 1:
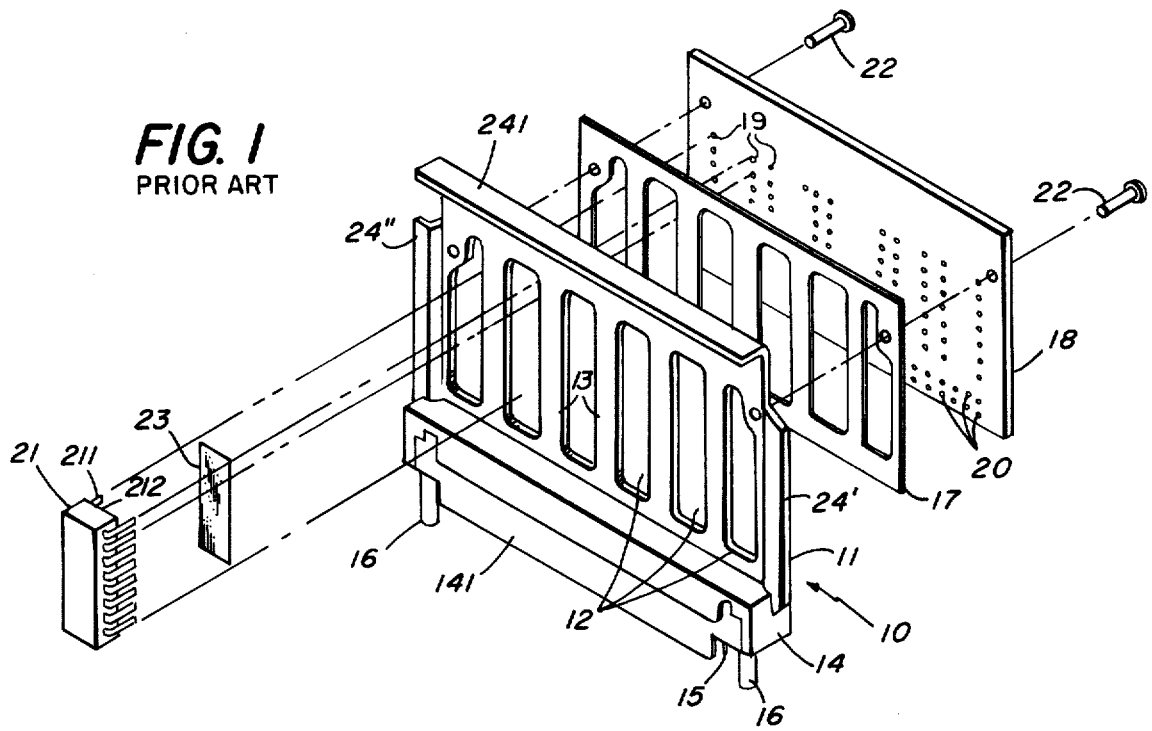
FIG. 1 is an exploded perspective view of a prior art module for DIP circuits.

An assembled module 60 is shown in partial cross-section in FIG. 4. FIG. 4 illustrates the manner in which the circuit board 18 with its circuit components 21 nests within the holder 40 to provide a module 60 which has the heat dissipating characteristics of the assembly of FIG. 1 but with the fabrication simplicity of the assembly of FIG. 2.

In certain applications such as for use in military equipment there is a requirement that the printed circuit board and its components be conformally coated to protect the completed board from the effects of the environment in which the circuit may be used. For those cases where the 4½ watts power dissipation is required and thus the configuration of FIG. 1 of the prior art was needed, it was necessary to first assemble the module of FIG. 1 after which masking of the sides 24, top 241, and the connector 14 was necessary prior to applying the conformal coating. These masking steps considerably increase the cost of fabricating the module of FIG. 1. In contrast, in the module of the invention shown in FIG. 3 the conformal coating of the printed circuit board 18 and its components 21 occurs after the assembly and soldering of the components 21 and connector 14 to the printed circuit board 18. The completed board 41 needs only a rubber boot (not shown) applied over the connector 14 prior to conformal coating of the completed circuit board. The rubber boot is removed prior to inserting the completed circuit board 41 into the holder of FIG. 3. The simplicity of conformally coating the completed circuit board 41 of the invention relates to the process required by the prior art boards and modules in a considerable cost saving in its fabrication.

Figure 2:
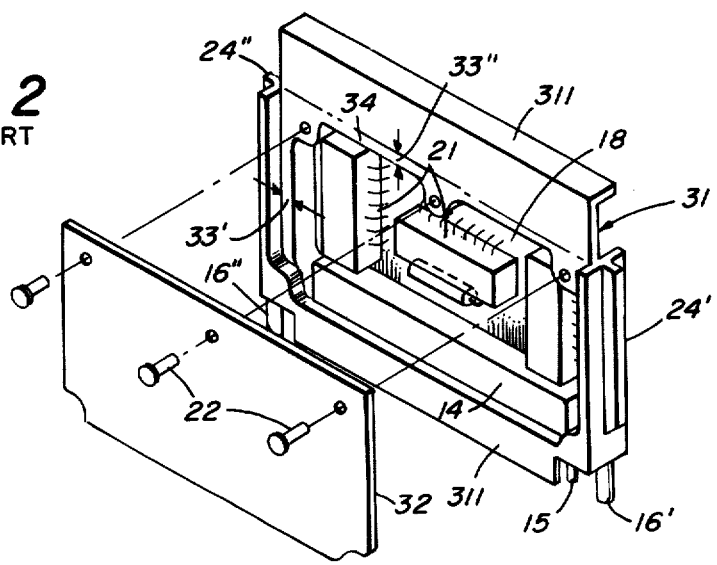
FIG. 2 is a partially exploded perspective view of another embodiment of a module for DIP circuits.

Dimensions of a holder which has been established as a Standard Electronics Module (SEM) by the U.S. Government are shown in FIG. 4. The exterior dimensions shown are the same for all the holders shown in the figures. In order to utilize the width of a circuit board 18 to the maximum, the width of the shoulder 33 for supporting the circuit board is made as narrow as feasible, the width is shown in FIG. 4 to be approximately 0.03 inches. The shoulder 33 is the same width as shoulder 33' of FIG. 2 which supports the thermally conducting cover plate 32. The cover plate 32 also extends a distance 33" of substantially the same dimension in overlapping relationship with respect to the handle portion 311 of the holder 31 as shown in FIG. 2. Thus, it is seen that the cover plate 32 is restricted in its area of contact with the holder 31, and therefore the thermal resistance between them is substantial. Therefore, there is only a marginal increase (from one watt to one and one half watts) in the maximum allowable power dissipation of the printed circuit board components when the cover plate 32 is used over the allowable power dissipation when the cover plate is not used in FIG. 2. Since the regions of overlap 33 of the cover plate 32 with respect to the holder 31 is limited by the constraints placed upon the physical dimensions of the SEM and the need to utilize as much of the printed circuit board as possible, the usefulness of a cover plate 32 is limited usefulness because of the small increase in prior classification over that of the standard open frame module of FIG. 2 without the cover plate 32.

The thickness of the heat conducting plate 47 is limited by the maximum allowable thickness of the SEM holder 40 and is substantially 0.08 inches thick except in the regions of the depressions 48 where the plate 47 thickness is only 0.04 inches thick. As explained previously, the depressions 48 are located in the region where the integrated circuit components 21 will be closest to the back plate 47. The depressions provide additional clearance without substantially reducing the heat transfer capabilities of the backing plate 47. The depth 331 of the support shelf 33 is just sufficient to prevent the printed circuit board 18 and the globules of solder 411 on the wire leads from components 21 from projecting above the tops 451 of section 45. This dimension is typically 0.04 inches.

The dramatic improvement in the power dissipation capabilities (from one to four and one-half watts) of the SEM module built according to this invention as shown in FIGS. 3 and 4, while still complying with the physical limitations of the standard electronic module, is remarkable in view of its appearance of similarities to the module of FIG. 2 of the prior art. The integral construction holder of this invention shown in FIGS. 3 and 4 provides improved thermal conduction between that portion 52 of the holder 40 to which heat is transferred by the components 21 of the printed circuit board 18 and that portion of the holder, the guide bars 24, from which the heat is dissipated by the water cooled spring fingers of the heat sink which is incorporated in the rack for which the module 60 is inserted.

Having described a preferred embodiment of the invention it will now be apparent to one of skill in the art that other embodiments incorporating its concept may be used. It is believed therefore that this invention should not be restricted to the disclosed embodiment but rather should be limited only by the spirit and scope of the appended claims.

What is claimed is:

1. A printed circuit board and holder wherein the holder comprises a thermally conductive frame having a peripheral boundary, a first portion of the peripheral boundary having an integrally formed thermal transfer guide along a portion of the outermost periphery of said frame;

said frame having a circuit board supporting shoulder which supports a planar printed circuit board having connector pins at one end of said board such that said connector pins are disposed adjacent to and within a second portion of the peripheral boundary disposed opposite said first portion of said peripheral boundary;

said peripheral boundary of said frame defining within said frame a volume substantially equal to the product of area within said boundary and the thickness of said frame;

said printed circuit board having heat producing electrical elements mounted thereon which in combination with said board have a volume disposed within the volume of said frame and having said heat producing elements mounted on one side thereof within the volume of said frame, said board and said heat producing elements having a combined thickness less than the thickness of said frame, wherein the improvement comprises:

said frame includes additionally a thermally conducting flat non-perforated plate integrally formed with and unitary with said frame and adjacent to said heat producing elements to provide a high thermal conductance path with said frame along at least the portion of the peripheral boundary of said frame having said integrally formed thermal transfer guide, said thermally conducting plate being substantially planar and having a surface which is coplanar with a surface of the periphery of said frame and parallel with said planar printed circuit board; said plate having plural depressions at the locations of said heat producing elements whereby said elements extend into said depressions, and a thermally conductive material in contact with and between said heat producing elements and said plate.

2. The structure of claim 1 comprising in addition:

ribs extending transversely from said plate, said ribs being integrally formed with and unitary with said plate and separating said depressions adjacent to said heat producing elements.

3. The structure of claim 1 wherein said thermally conductive material is also an electrical insulator.

4. The structure of claim 1 wherein said heat producing elements are in thermal contact through said thermally conductive material with said plate at the surfaces of said elements most remote from said board.

5. The structure of claim 1 wherein said portion of the frame with which said plate is integrally formed is the entire periphery of said frame.

6. An electronic module comprising:
a holder;
a printed circuit board attached to a holder;
said printed circuit board having electrical wiring thereon;
a pin connector attached to one end of said board, the pins of said connector making electrical connection to said wiring;
electrical components;
said components being connected to said wiring, the assembly of said connector and components to said board forming a completed board;
said holder being a thermally conductive holder;
said holder containing said completed board;
said holder comprising a flat back plate, unitary with and integrally formed with three contiguous sides at the periphery of said back plate, said three sides extending transversely to said back plate to form a holder having said back plate and three sides, said holder therefore being box-like and having an open end and top, the side opposite said open end being formed to provide a handle, the other two sides being characterized as the guide sides, the back plate extending beyond said guide sides at the open end of said holder to form a first guard for the pins of said connector, a second guard attached to said guide sides and opposite said first guard with said connector pins between said guards at the open end of said holder;
each of said guide sides having a transversely extending outward projection, each projection forming a guide for the insertion of said holder with its associated connector pins into a mating socket for said pins;
each of said guide sides having a shoulder on the inner portion of said guide side, said shoulder extending inwardly a distance and supporting said completed circuit board;
one side of said completed circuit board having printed wiring and solder connections for electrical components which components are on the other side of said completed circuit board;
the height of said guide side above the height of said shoulder being greater than the thickness of said completed circuit board including said wiring and solder connections of said one side;
the height of said shoulder above said back plate being not greater than the thickness of said mounted components on said other side of said circuit board;
said electrical components include an integrated circuit which has a mounted height greater than the height of said shoulder above said back plate;
said back plate being recessed at the location of said integrated circuit allowing said integrated circuit to extend into said recess, said board resting against said shoulder; and
a thermally conductive material placed between said integrated circuit and said recessed back plate.

7. The structure of claim 6 wherein said thermally conductive material is also an electrical insulator.

8. An electronic module comprising:
a holder;
a printed circuit board attached to a holder;
said printed circuit board having electrical wiring thereon;
a pin connector attached to one end of said board, the pins of said connector making electrical connection to said wiring;
electrical components;
said components being connected to said wiring, the assembly of said connector and components to said board forming a completed board;
said holder being a thermally conductive holder;
said holder containing said completed board;
said holder comprising a flat back plate, unitary with and integrally formed with three contiguous sides at the periphery of said back plate, said three sides extending transversely to said back plate to form a holder having said back plate and three sides, said holder therefore being box-like and having an open end and top, the side opposite said open end being formed to provide a handle, the other two sides being characterized as the guide sides, the back plate extending beyond said guide sides at the open end of said holder to form a first guard for the pins of said connector, a second guard attached to said guide sides and opposite said first guard with said connector pins between said guards at the open end of said holder;
each of said guide sides having a transversely extending outward projection, each projection forming a guide for the insertion of said holder with its associated connector pins into a mating socket for said pins;
each of said guide sides having a shoulder on the inner portion of said guide side, said shoulder extending inwardly a distance and supporting said completed circuit board;
one side of said completed circuit board having only printed wiring and solder connections for electrical components located on the other side of said completed circuit board;
the height of said guide side above the height of said shoulder being greater than the thickness of said completed circuit board including its wiring and solder connectors to said components of said one side;
the height of said shoulder above said back plate being at least equal to the thickness of said other side of said completed connector having said mounted components;
said back plate having transversely extending projections integrally formed with and unitary with said back plate between the locations of said electrical components allowing said electrical components to extend into the space between said projections, said board resting against said shoulder; and
a thermally conductive material placed between said electrical components and said back plate.

9. The structure of claim 8 wherein said thermally conductive material is also an electrical insulator.

10. An electronic module comprising:
a holder;
a printed circuit board attached to a holder;
said printed circuit board having electrical wiring thereon;

a pin connector attached to one end of said board, the pins of said connector making electrical connection to said wiring;

electrical components;

said components being connected to said wiring, the assembly of said connector and components to said board forming a completed board;

said holder being a thermally conductive holder;

said holder containing said completed board;

said holder comprising a flat back plate, unitary with and integrally formed with three contiguous sides at the periphery of said back plate, said three sides extending transversely to said back plate to form a holder having said back plate and three sides, said holder therefore being box-like and having an open end and top, the side opposite said open end being formed to provide a handle, the other two sides being characterized as the guide sides, the back plate extending beyond said guide sides at the open end of said holder to form a first guard for the pins of said connector, a second guard attached to said guide sides and opposite said first guard with said connector pins between said guards at the open end of said holder;

each of said guide sides having a transversely extending outward projection, each projection forming a guide for the insertion of said holder with its associated connector pins into a mating socket for said pins;

each of said guide sides having a shoulder on the inner portion of said guide side, said shoulder extending inwardly a distance and supporting said completed circuit board;

one side of said completed circuit board having printed wiring and solder connections for electrical components which components are on the other side of said completed circuit board;

the height of said guide side above the height of said shoulder being greater than the thickness of said completed circuit board including said wiring and solder connections of said one side;

the height of said shoulder above said back plate being greater than the thickness of said components on said other side of said completed circuit board;

said electrical components including an integrated circuit which has a mounted height less than the height of said shoulder above said printed circuit board;

a thermally conductive material placed between said electrical components and said integrated circuit and said back plate.

11. The structure of claim 10 wherein said thermally conductive material is also an electrical insulator.

* * * * *